United States Patent
Li et al.

(10) Patent No.: US 8,947,804 B2
(45) Date of Patent: Feb. 3, 2015

(54) SYSTEMS AND METHODS FOR COMBINED BINARY AND NON-BINARY DATA PROCESSING

(75) Inventors: Zongwang Li, San Jose, CA (US); Chung-Li Wang, San Jose, CA (US); Shaohua Yang, San Jose, CA (US); Changyou Xu, Fremont, CA (US); Lei Chen, Santa Clara, CA (US); Yang Han, Sunnyvale, CA (US)

(73) Assignee: LSI Corporation, San Jose, CA (US)

( * ) Notice: Subject to any disclaimer, the term of this patent is extended or adjusted under 35 U.S.C. 154(b) by 174 days.

(21) Appl. No.: 13/316,758

(22) Filed: Dec. 12, 2011

(65) Prior Publication Data
US 2013/0148232 A1 Jun. 13, 2013

(51) Int. Cl.
*G11B 5/02* (2006.01)
*H03M 13/11* (2006.01)

(52) U.S. Cl.
CPC ............. *G11B 5/02* (2013.01); *H03M 13/1171* (2013.01)
USPC .................. 360/39; 360/55; 341/50; 714/778; 714/795

(58) Field of Classification Search
CPC .............. H03M 7/00; H03M 13/1171; H03M 13/1174; H03M 13/134; G11B 5/035; G11B 5/012; G11B 5/02
USPC .................. 360/55, 65, 62, 39; 714/778, 795; 341/50
See application file for complete search history.

(56) References Cited

U.S. PATENT DOCUMENTS

| | | | |
|---|---|---|---|
| 6,404,582 B1 * | 6/2002 | Rodrigues de Miranda | 360/77.08 |
| 6,512,644 B1 * | 1/2003 | Hall et al. | 360/31 |
| 2002/0152443 A1 * | 10/2002 | Oh | 714/784 |
| 2003/0192007 A1 * | 10/2003 | Miller et al. | 714/782 |
| 2012/0331363 A1 * | 12/2012 | Li et al. | 714/746 |
| 2012/0331370 A1 * | 12/2012 | Li et al. | 714/795 |
| 2013/0019141 A1 * | 1/2013 | Wang et al. | 714/763 |

OTHER PUBLICATIONS

Declercq, "Decoding Algorithms for Nonbinary LDPC Codes over GF(q)", IEEE Trans. on Commun., vol. 55(4), pp. 633-643 (Apr. 2007).
U.S. Appl. No. 13/167,764, filed Jun. 24, 2011, Zongwang Li, Unpublished.
U.S. Appl. No. 13/251,340, filed Oct. 3, 2011, Haitao Xia, Unpublished.
U.S. Appl. No. 13/284,826, filed Oct. 28, 2011, Weijun Tan, Unpublished.
U.S. Appl. No. 13/274,443, filed Oct. 17, 2011, Chung-Li Wang, Unpublished.
U.S. Appl. No. 13/227,538, filed Sep. 8, 2011, Shaohua Yang, Unpublished.
U.S. Appl. No. 13/180,495, filed Jul. 11, 2011, Chung-Li Wang, Unpublished.

(Continued)

*Primary Examiner* — Thomas Alunkal
(74) *Attorney, Agent, or Firm* — Hamilton DeSanctis & Cha (57) ABSTRACT

Various embodiments of the present invention provide systems and methods for data processing. For example, a data processing system is disclosed that includes a combination data decoder circuit. The combination data decoder circuit includes: a non-binary data decoder circuit and a binary data decoder circuit.

30 Claims, 5 Drawing Sheets

(56) References Cited

OTHER PUBLICATIONS

Wymeersch et al., "Log-Domain Decoding of LDPC Codes Over GF(q)", IEEE Int. Conf. on Commun., vol. 2, pp. 772-776 (Jun. 2004).

Zhao, "Joint Detection/Decoding Algorithms for Nonbinary LDPC Codes over ISI Channels" [online] [ret. On Nov. 9, 2012] Ret. From Internet: http://arxiv.org/abs/1209.2542v1.

* cited by examiner

SYSTEMS AND METHODS FOR COMBINED BINARY AND NON-BINARY DATA PROCESSING

BACKGROUND OF THE INVENTION

The present inventions are related to systems and methods for data processing, and more particularly to systems and methods for data decoding.

Various storage systems include data processing circuitry implemented with a data decoding circuit. In some cases, a belief propagation based decoder circuit is used. In such cases where high rate low density parity check codes are used, an error floor is more severe because short cycles are unavoidable. Such short cycles make the messages in the belief propagation decoder correlate quickly and degrade the performance. In contrast, a maximum likelihood decoder may be used as it does not exhibit the same limitations. However, such maximum likelihood decoders are typically too complex for practical implementation.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for data decoding.

Various embodiments of the present invention provide data processing systems. Such data processing systems include a combination data decoder circuit. The combination data decoder circuit includes: a non-binary data decoder circuit operable to apply a non-binary data decode algorithm to a non-binary decoder input to yield a non-binary decoded output; a non-binary symbol to binary symbol conversion circuit operable to convert a non-binary symbol in the non-binary decoder input into a corresponding binary symbol in a binary decoder input; a binary data decoder circuit operable to apply a binary data decode algorithm to the binary decoder input to yield a binary decoded output; and a binary symbol to non-binary symbol converter circuit operable to convert a binary symbol in the binary decoded output into a corresponding non-binary symbol in a converted non-binary decoded output.

In some instances of the aforementioned embodiments, the non-binary data decoder circuit and the binary data decoder circuit share common circuitry. In other instances of the aforementioned embodiments, the combination data decoder circuit further includes a controller circuit operable to enable one of the non-binary data decoder circuit or the binary data decoder circuit to operate on the non-binary decoder input. In particular instances of the aforementioned embodiments, the non-binary data decoder circuit is operable to apply the non-binary data decode algorithm to the non-binary decoder input in parallel to the binary data decoder circuit applying the binary data decode algorithm to the binary decoder input. In such instances, the combination data decoder circuit further includes a controller circuit operable to select one of the non-binary decoded output and the converted non-binary decoded output for use in subsequent operation of the combination data decoder circuit.

In various instances of the aforementioned embodiments, the non-binary data decode algorithm is a low density parity check algorithm. In some such instances, the non-binary decoder input is a series of two bit non-binary symbols. In some embodiments of the present invention, the binary data decode algorithm is a low density parity check algorithm. In particular cases, the non-binary decoder input is a series of two bit non-binary symbols, the non-binary decoder outputs is a series of two bit non-binary symbols, and the converted non-binary decoder outputs is a series of two bit non-binary symbols.

Other embodiments of the present invention, provide methods for data processing that include: applying a non-binary data decode algorithm to a non-binary decoder input to yield a first decoded output; applying a binary data decode algorithm to a derivative of the non-binary decoder input to yield a second decoded output; selecting one of the first decoded output and the second decoded output that corresponds to an original data set; and providing a data output derived from the selected one of the first decoded output and the second decoded output as a data output. In some instances of the aforementioned methods, the methods further include: converting a non-binary symbol value in the non-binary decoder input to a corresponding binary value in a binary decoder input; and converting the second decoded output to a non-binary decoded output, such that selecting one of the first decoded output and the second decoded output involves selecting one of the first decoded output and the non-binary decoded output. In such instances, the derivative of the non-binary decoder input is the binary decoder input. In some cases, applying the non-binary data decode algorithm to the non-binary decoder input is done in parallel with applying the binary data decode algorithm to the derivative of the non-binary decoder input. In other cases, applying the non-binary data decode algorithm to the non-binary decoder input is completed prior to applying the binary data decode algorithm to the derivative of the non-binary decoder input. In some particular cases, applying the binary data decode algorithm to the derivative of the non-binary decoder input is guided by the first decoded output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for data decoding.

Various embodiments of the present invention provide data processing systems that include a data decoder circuit that includes both a non-binary data decoder circuit and a binary data decoder circuit. In some cases, the non-binary data decoder circuit and the binary data decoder circuit share common circuitry. In other cases, the non-binary data decoder circuit and the binary data decoder circuit are implemented separately and can operate in parallel. In some cases, depending upon the results provided from one of the non-binary data decoder circuit or the binary data decoder circuit, a subsequent iteration through the data decoder circuit is selected to be one or the other of the non-binary data decoder circuit or the binary data decoder circuit.

Figure 1:
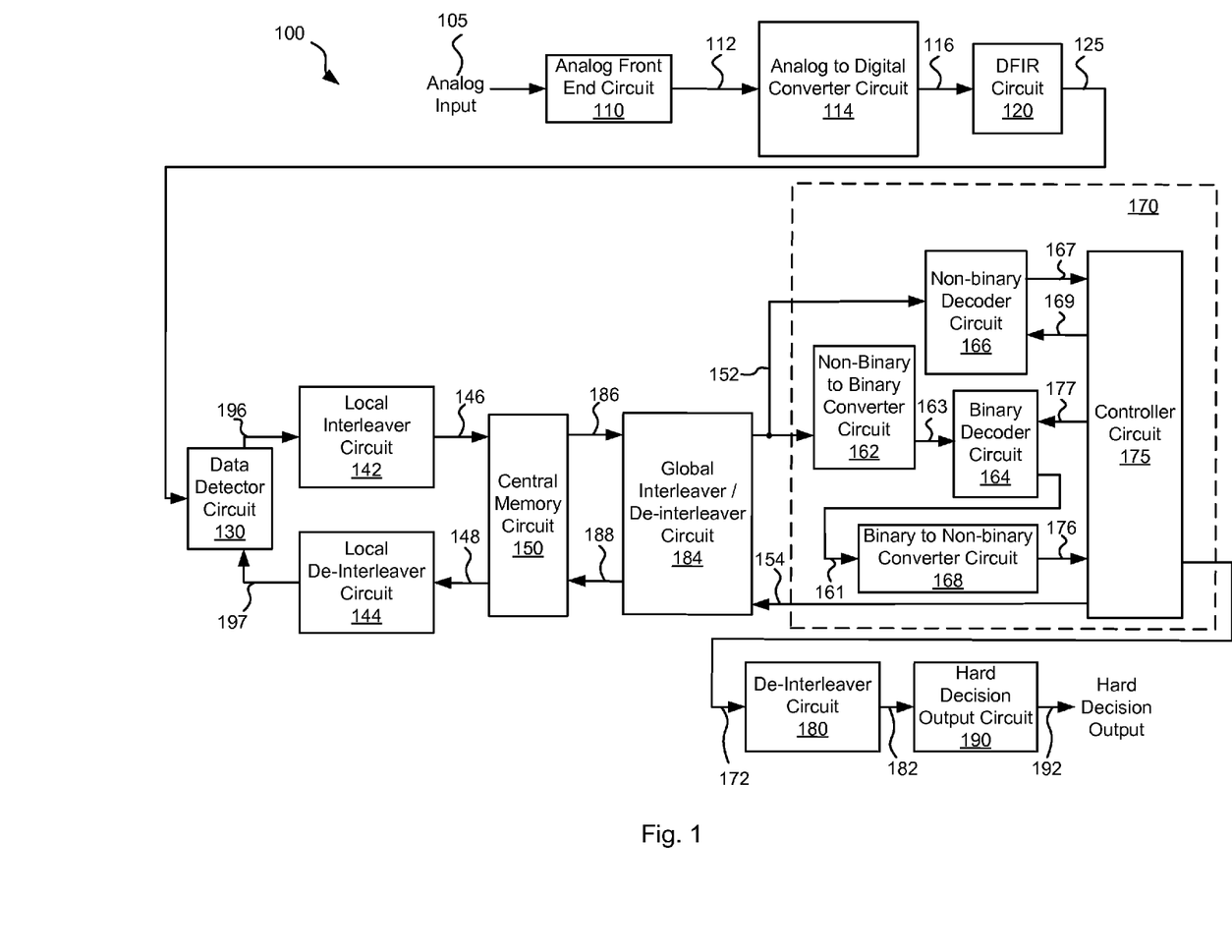
FIG. 1 shows a data processing circuit including a combination data decoder circuit including a combination of a non-binary data decoder circuit and a binary data decoder circuit in accordance with one or more embodiments of the present invention.

Turning to FIG. 1, a data processing circuit 100 is shown that includes a combination data decoder circuit 170 including a non-binary decoder circuit 166 and a binary decoder circuit 164 in accordance with one or more embodiments of the present invention. Data processing circuit 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. In some cases, equalizer circuit 120 includes sufficient memory to maintain one or more codewords until a data detector circuit 130 is available for processing, and for multiple processes through data detector circuit 130.

Data detector circuit 130 is operable to apply a data detection algorithm to a received codeword or data set, and in some cases data detector circuit 130 can process two or more codewords in parallel. In some embodiments of the present invention, data detector circuit 130 is a Viterbi algorithm data detector circuit as are known in the art. In other embodiments of the present invention, data detector circuit 130 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 130 is started based upon availability of a data set from equalizer circuit 120 or from a central memory circuit 150.

Upon completion, data detector circuit 130 provides a detector output 196. Detector output 196 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 196 is provided to a local interleaver circuit 142. Local interleaver circuit 142 is operable to shuffle sub-portions (i.e., local chunks) of the data set included as detected output and provides an interleaved codeword 146 that is stored to central memory circuit 150. Interleaver circuit 142 may be any circuit known in the art that is capable of shuffling data sets to yield a re-arranged data set. Interleaved codeword 146 is stored to central memory circuit 150. Interleaved codeword 146 is comprised of a number of encoded sub-codewords designed to reduce the complexity of a downstream data decoder circuit while maintaining reasonable processing ability.

Once data decoding circuit 170 is available, a previously stored interleaved codeword 146 is accessed from central memory circuit 150 as a stored codeword 186 and globally interleaved by a global interleaver/de-interleaver circuit 184. Global interleaver/De-interleaver circuit 184 may be any circuit known in the art that is capable of globally rearranging codewords. Global interleaver/De-interleaver circuit 184 provides a decoder input 152 input to low data decoder circuit 170.

Data decoder circuit 170 includes non-binary decoder circuit 166 and binary decoder circuit 164. In addition, a non-binary to binary converter circuit 162 and a binary to non-binary converter circuit 168, and a controller circuit 175 are included as part of data decoder circuit 170. In this embodiment of the present invention, non-binary decoder circuit 166 and binary decoder circuit 164 are implemented as independent circuits allowing them to operate in parallel, or to be selectively enabled under the control of controller circuit 175.

Parallel operation verses selective operation of one or the other of non-binary decoder circuit 166 and binary decoder circuit 164 may be selected or designed depending upon a tradeoff between power usage and performance. Binary decoder circuit 164 may be any data decoder circuit known in the art that is capable of processing binary data. In some cases, binary decoder circuit 164 is a low density parity check decoder circuit as are known in the art. Based upon the disclosure provided herein, one of ordinary skill in the art will recognize a variety of binary decoder circuits that may be used in relation to different embodiments of the present invention. Non-binary decoder circuit 166 may be any data decoder circuit known in the art that is capable of processing non-binary symbol data. In some cases, non-binary decoder circuit 166 is a low density parity check decoder circuit as are known in the art. In one particular case, non-binary decoder circuit 166 may be implemented similar to that described in U.S. patent application Ser. No. 13/180,495 entitled "Min-Sum Based Non-Binary LDPC Decoder", and filed Jul. 11, 2011 by Wang et al. The entirety of the aforementioned reference is incorporated herein by reference for all purposes. Based upon the disclosure provided herein, one of ordinary skill in the art will recognize a variety of non-binary decoder circuits that may be used in relation to different embodiments of the present invention.

In one type of operation, a non-binary data decode algorithm is applied to decoder input 152 by non-binary decoder circuit 166. In such a situation, an enable signal 169 is provided from controller circuit 175 to non-binary decoder circuit 166 to enable processing. Non-binary decoder circuit 167 provides a non-binary decoded output 167 to controller circuit 175. Where non-binary output 167 converges (i.e., yields the original data set), controller circuit 175 provides the result as an output codeword 172 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order data sets that may complete out of order back into their original order. The originally ordered data sets are then provided as a hard decision output 192.

Alternatively, where non-binary output 167 fails to converge (i.e., fails to yield the original data set), controller circuit 175 determines whether a subsequent iteration through data decoder circuit 170 is desired. In some cases, a maximum number of passes through data decoder circuit 170 (i.e., local iterations) are allowed before a codeword is passed back for another pass through data detector circuit 130 (i.e., to start a global iteration that comprises processing through both data detector circuit 130 and data decoder circuit 170). Where another local iteration is desired, controller circuit 175 selects whether the subsequent local iteration will be performed by non-binary decoder circuit 166 or by binary decoder circuit 164. In some cases, the selection is always to alternate between non-binary decoder circuit 166 and binary decoder circuit 164. In other cases, the number of outstanding errors in non-binary output 167 is used by controller circuit 175 to select whether another pass through non-binary decoder circuit 166 or binary decoder circuit 164 is to be done.

Depending upon which of non-binary decoder circuit 166 or binary decoder circuit 164 is selected to perform the subsequent local iteration, controller circuit 175 asserts either enable signal 169 or enable signal 177. In the case where binary decoder circuit 164 is selected, controller circuit 175 asserts enable signal 177 and de-asserts enable signal 169. Non-binary to binary converter circuit 162 converts decoder input 152 to a binary equivalent that is provided as a binary output 163 to binary decoder circuit 164. In some cases, the conversion is done in accordance with the following equations:

$$(\text{Binary Output 163})_i = \sum_{mod\left(\left\lfloor\frac{j}{2^i}\right\rfloor,2\right)==1} (\text{Decoder Input 152})_j - \sum_{mod\left(\left\lfloor\frac{j}{2^i}\right\rfloor,2\right)==0} (\text{Decoder Input 152})_j$$

Decoder input 152 is a series of log likelihood ratio vales (LLRs), and binary output 163 is also a series of LLRs. The aforementioned equation applies for the natural non-binary LLRs over GF($2^q$) (LLR0, LLR1 . . . LLR$2^q$−1) relating to corresponding hard decisions (0, 1 . . . $2^q$−1).

Binary decoder circuit 164 applies a binary decoding algorithm to yield a decoded output 161 that is provided to a binary to non-binary converter circuit 168. Binary to non-binary converter circuit 168 converts decoded output 161 to a converted non-binary decoded output 176. In some cases, the conversion is done in accordance with the following equations:

$$(\text{Non-Binary Output 176})_i = \sum_{mod\left(\left\lfloor\frac{i}{2^j}\right\rfloor,2\right)==1} \frac{e^{(\text{Output 161})_j}}{1+e^{(\text{Output 161})_j}} + \sum_{mod\left(\left\lfloor\frac{i}{2^j}\right\rfloor,2\right)==0} \frac{1}{1+e^{(\text{Output 161})_j}}$$

Non-binary decoder output 176 is a series of log likelihood ratio vales (LLRs), and decoded output 161 is also a series of LLRs. The aforementioned equation applies for the natural non-binary LLRs over GF($2^q$) (LLR0, LLR1 . . . LLR$2^q$−1) relating to corresponding hard decisions (0, 1 . . . $2^q$−1). Non-binary decoder output 176 is provided to controller circuit 175. Depending upon the results indicated by non-binary decoder output 176 is provided to controller circuit 175, controller circuit 175 provides either output codeword 172, decoder output 154, or selects one of non-binary decoder circuit 166 or binary decoder circuit 164 to perform a subsequent local iteration through data decoder circuit 170.

Alternatively, where non-binary output 167 fails to converge (i.e., fails to yield the original data set) and a subsequent iteration through data decoder circuit 170 is not desired, controller circuit 175 provides a decoder output 154 (i.e., non-binary decoder output 167 or converted non-binary decoder output 176) back to central memory circuit 150 via global interleaver/de-interleaver circuit 184. Prior to storage of decoded output 154 to central memory circuit 150, decoded output 154 is globally de-interleaved to yield a globally de-interleaved output 188 that is stored to central memory circuit 150. The global de-interleaving reverses the global interleaving earlier applied to stored codeword 186 to yield decoder input 152. Once data detector circuit 130 is available, a previously stored de-interleaved output 188 is accessed from central memory circuit 150 and locally de-interleaved by a de-interleaver circuit 144. De-interleaver circuit 144 re-arranges decoder output 148 to reverse the shuffling originally performed by interleaver circuit 142. A resulting de-interleaved output 197 is provided to data detector circuit 130 where it is used to guide subsequent detection of a corresponding data set receive as equalized output 125.

In another type of operation, a non-binary data decode algorithm is applied to decoder input 152 by non-binary decoder circuit 166 in parallel with application of a binary data decode algorithm to decoder input 152 by binary decoder circuit 164. In such a situation, enable signal 169 is provided from controller circuit 175 to non-binary decoder circuit 166 to enable processing, and at the same time enable signal 177 is provided from controller circuit 175 to binary decoder circuit 164 to enable processing.

Non-binary decoder circuit 167 provides a non-binary decoded output 167 to controller circuit 175. In parallel, non-binary to binary converter circuit 162 converts decoder input 152 to a binary equivalent that is provided as a binary output 163 to binary decoder circuit 164. In some cases, the conversion is done in accordance with the following equations:

$$(\text{Binary Output 163})_i = \sum_{mod\left(\left\lfloor\frac{j}{2^i}\right\rfloor,2\right)==1} (\text{Decoder Input 152})_j - \sum_{mod\left(\left\lfloor\frac{j}{2^i}\right\rfloor,2\right)==0} (\text{Decoder Input 152})_j$$

Decoder input 152 is a series of log likelihood ratio vales (LLRs), and binary output 163 is also a series of LLRs. The aforementioned equation applies for the natural non-binary LLRs over GF($2^q$) (LLR0, LLR1 . . . LLR$2^q$–1) relating to corresponding hard decisions (0, 1 . . . $2^q$–1). Binary decoder circuit 164 applies a binary decoding algorithm to yield a decoded output 161 that is provided to a binary to non-binary converter circuit 168. Binary to non-binary converter circuit 168 converts decoded output 161 to a converted non-binary decoded output 176. In some cases, the conversion is done in accordance with the following equations:

$$(\text{Non-Binary Output 176})_i = \sum_{mod\left(\left\lfloor\frac{i}{2^j}\right\rfloor,2\right)==1} \frac{e^{(\text{Output 161})_j}}{1+e^{(\text{Output 161})_j}} + \sum_{mod\left(\left\lfloor\frac{i}{2^j}\right\rfloor,2\right)==0} \frac{1}{1+e^{(\text{Output 161})_j}}$$

Converted non-binary decoder output 176 is a series of log likelihood ratio vales (LLRs), and decoded output 161 is also a series of LLRs. The aforementioned equation applies for the natural non-binary LLRs over GF($2^q$) (LLR0, LLR1 . . . LLR$2^q$–1) relating to corresponding hard decisions (0, 1 . . . $2^q$–1). Converted non-binary decoder output 176 is provided to controller circuit 175.

Where either converted non-binary decoder output 176 or non-binary decoder output 167 converges, controller circuit 175 provides the converging output as output codeword 172 to de-interleaver circuit 180. De-interleaver circuit 180 rearranges the data to reverse both the global and local interleaving applied to the data to yield de-interleaved output 182. De-interleaved output 182 is provided to hard decision output circuit 190. Hard decision output circuit 190 is operable to re-order data sets that may complete out of order back into their original order. The originally ordered data sets are then provided as a hard decision output 192.

Alternatively, where both non-binary output 167 and converted non-binary output 176 fail to converge, controller circuit 175 determines whether a subsequent iteration through data decoder circuit 170 is desired. In some cases, a maximum number of passes through data decoder circuit 170 (i.e., local iterations) are allowed before a codeword is passed back for another pass through data detector circuit 130 (i.e., to start a global iteration that comprises processing through both data detector circuit 130 and data decoder circuit 170). Where another local iteration is desired, controller circuit 175 causes both non-binary decoder circuit 166 and binary decoder circuit 164 to apply their respective algorithms guided by the resulting non-binary decoder outputs to yield an updated non-binary decoder output 167 and converted non-binary decoder output 176.

Alternatively, where no additional iterations through data decoder circuit 170 are desired, controller circuit 175 provides a decoder output 154 (i.e., non-binary decoder output 167 or converted non-binary decoder output 176 depending upon which is more reliable) back to central memory circuit 150 via global interleaver/de-interleaver circuit 184. Prior to storage of decoded output 154 to central memory circuit 150, decoded output 154 is globally de-interleaved to yield a globally de-interleaved output 188 that is stored to central memory circuit 150. The global de-interleaving reverses the global interleaving earlier applied to stored codeword 186 to yield decoder input 152. Once data detector circuit 130 is available, a previously stored de-interleaved output 188 is accessed from central memory circuit 150 and locally de-interleaved by a de-interleaver circuit 144. De-interleaver circuit 144 re-arranges decoder output 148 to reverse the shuffling originally performed by interleaver circuit 142. A resulting de-interleaved output 197 is provided to data detector circuit 130 where it is used to guide subsequent detection of a corresponding data set receive as equalized output 125.

Figure 2:
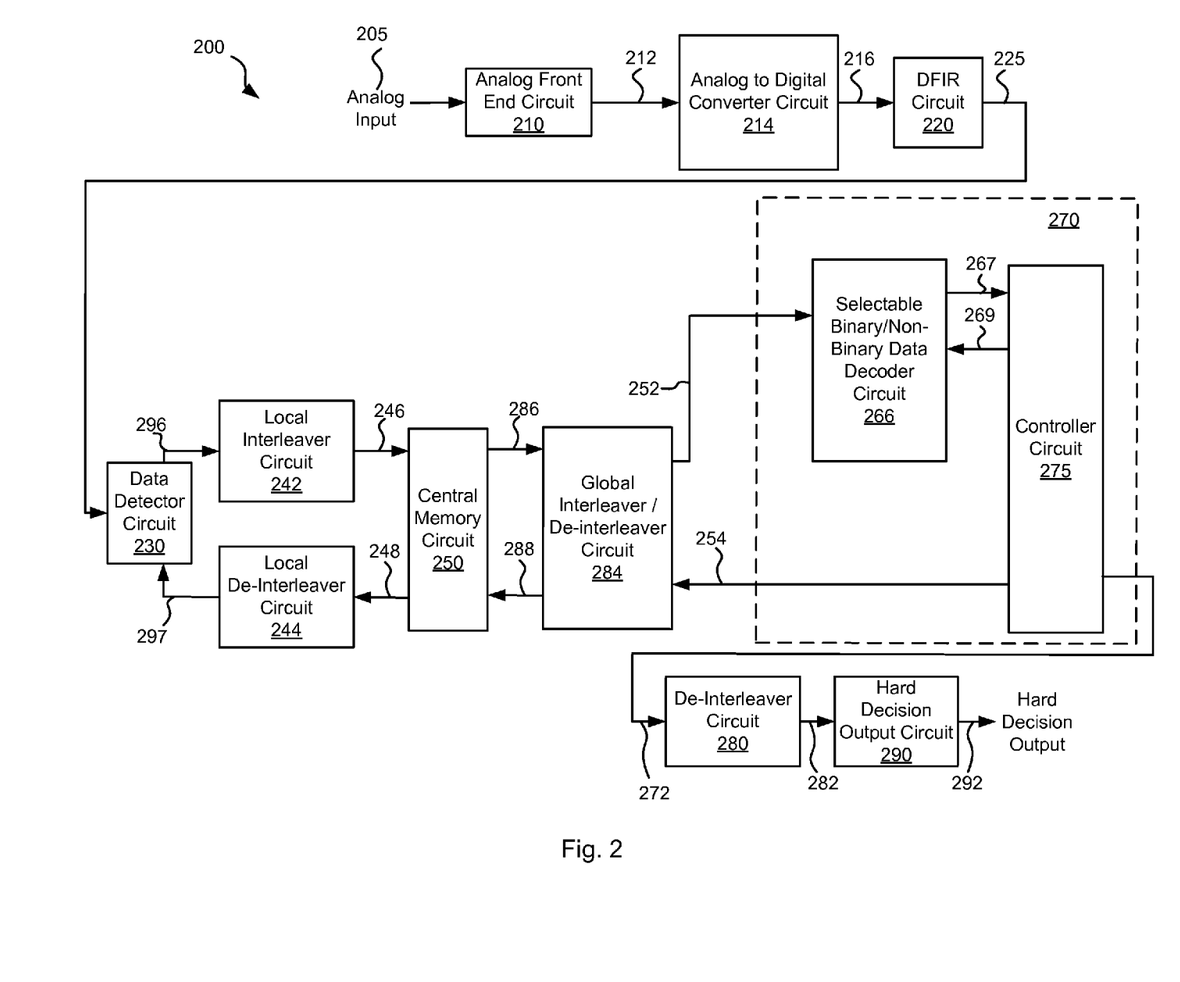
FIG. 2 shows a data processing circuit including a data decoder circuit having a combination non-binary/binary data decoder circuit in accordance with some embodiments of the present invention.

Turning to FIG. 2, a data processing circuit including a data decoder circuit 270 having a combination non-binary/binary data decoder circuit 266 is shown in accordance with some embodiments of the present invention. Data processing circuit 200 includes an analog front end circuit 210 that receives an analog signal 205. Analog front end circuit 210 processes analog signal 205 and provides a processed analog signal 212 to an analog to digital converter circuit 214. Analog front end circuit 210 may include, but is not limited to, an analog filter and an amplifier circuit as are known in the art. Based upon the disclosure provided herein, one of ordinary skill in the art will recognize a variety of circuitry that may be included as part of analog front end circuit 210. In some cases, analog signal 205 is derived from a read/write head assembly (not shown) that is disposed in relation to a storage medium (not shown). In other cases, analog signal 205 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 205 may be derived.

Analog to digital converter circuit 214 converts processed analog signal 212 into a corresponding series of digital samples 216. Analog to digital converter circuit 214 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 216 are provided to an equalizer circuit 220. Equalizer circuit 220 applies an equalization algorithm to digital samples 216 to yield an equalized output 225. In some embodiments of the present invention, equalizer circuit 220 is a digital finite impulse response filter circuit as are known in the art. In some cases, equalizer circuit 220 includes sufficient memory to maintain one or more codewords until a data detector circuit 230 is available for processing, and for multiple processes through data detector circuit 230.

Data detector circuit 230 is operable to apply a data detection algorithm to a received codeword or data set, and in some cases data detector circuit 230 can process two or more codewords in parallel. In some embodiments of the present invention, data detector circuit 230 is a Viterbi algorithm data detector circuit as are known in the art. In other embodiments of the present invention, data detector circuit 230 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 230 is started based upon availability of a data set from equalizer circuit 220 or from a central memory circuit 250.

Upon completion, data detector circuit 230 provides a detector output 296. Detector output 296 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio (LLR) data as is known in the art. Detected output 296 is provided to a local interleaver circuit 242. Local interleaver circuit 242 is operable to shuffle sub-portions (i.e., local chunks) of the data set included as detected output and provides an interleaved codeword 246 that is stored to central memory circuit 250. Interleaver circuit 242 may be any circuit known in the art that is capable of shuffling data sets to yield a re-arranged data set. Interleaved codeword 246 is stored to central memory circuit 250. Interleaved codeword 246 is comprised of a number of encoded sub-codewords designed to reduce the complexity of a downstream data decoder circuit while maintaining reasonable processing ability.

Once data decoding circuit 270 is available, a previously stored interleaved codeword 246 is accessed from central memory circuit 250 as a stored codeword 286 and globally interleaved by a global interleaver/de-interleaver circuit 284. Global interleaver/De-interleaver circuit 284 may be any circuit known in the art that is capable of globally rearranging codewords. Global interleaver/De-interleaver circuit 284 provides a decoder input 252 input to low data decoder circuit 270.

Data decoder circuit 270 includes a selectable binary/non-binary data decoder circuit 266 and a controller circuit 275. Selectable binary/non-binary data decoder circuit 266 may be configured either as a non-binary data decoder circuit, or a binary data decoder circuit and associated non-binary to binary conversion circuit and binary to non-binary conversion circuit. Controller circuit 175 provides a control input 269 that selects whether selectable binary/non-binary data decoder circuit 266 is configured for operation as a non-binary data decoder circuit or a binary decoder circuit along with associated non-binary to binary conversion circuit and binary to non-binary decoder circuit. The non-binary decoder circuit may be any non-binary decoder circuit known in the art. In some cases, the non-binary decoder circuit is a low density parity check decoder circuit as are known in the art. In one particular case, non-binary decoder circuit 266 may be implemented similar to that described in U.S. patent application Ser. No. 23/180,495 entitled "Min-Sum Based Non-Binary LDPC Decoder", and filed Jul. 21, 2011 by Wang et al. Based upon the disclosure provided herein, one of ordinary skill in the art will recognize a variety of non-binary decoder circuits that may be used in relation to different embodiments of the present invention. The binary decoder circuit may be any binary decoder circuit known in the art. In some cases, the binary decoder circuit is a low density parity check decoder circuit as are known in the art. Based upon the disclosure provided herein, one of ordinary skill in the art will recognize a variety of binary decoder circuits that may be used in relation to different embodiments of the present invention.

In operation, controller circuit 275 asserts control input 269 to configure selectable binary/non-binary data decoder circuit 266 as a non-binary data decoder circuit. The non-binary decoder circuit applies a non-binary data decode algorithm to decoder input 252 to yield a non-binary decoder output 267 that is provided to controller circuit 275. Where non-binary output 267 converges (i.e., yields the original data set), controller circuit 275 provides the result as an output codeword 272 to a de-interleaver circuit 280. De-interleaver circuit 280 rearranges the data to reverse both the global and local interleaving applied to the data to yield a de-interleaved output 282. De-interleaved output 282 is provided to a hard decision output circuit 290. Hard decision output circuit 290 is operable to re-order data sets that may complete out of order back into their original order. The originally ordered data sets are then provided as a hard decision output 292.

Alternatively, where non-binary output 267 fails to converge (i.e., fails to yield the original data set), controller circuit 275 determines whether a subsequent iteration through data decoder circuit 270 is desired. In some cases, a maximum number of passes through data decoder circuit 270 (i.e., local iterations) are allowed before a codeword is passed back for another pass through data detector circuit 230 (i.e., to start a global iteration that comprises processing through both data detector circuit 230 and data decoder circuit 270). Where another local iteration is desired, controller circuit 275 selects whether the subsequent local iteration will be performed by a non-binary decoder circuit or by a binary decoder circuit and configures selectable binary/non-binary data decoder circuit 266 accordingly. In some cases, the selection is always to alternate between a non-binary decoder circuit and a binary decoder circuit. In other cases, the number of outstanding errors in non-binary output 267 is used by controller circuit 275 to select whether another pass through a non-binary decoder circuit or a binary decoder circuit is to be done.

In the case where a binary decoder circuit is selected, controller circuit 275 asserts control signal 269 to configure selectable binary/non-binary data decoder circuit 266 as a binary decoder circuit. A non-binary to binary converter circuit converts decoder input 252 to a binary equivalent that is provided as a binary output to the configured binary decoder circuit. In some cases, the conversion is done in accordance with the following equations:

$$(\text{Binary Output})_i = \sum_{mod\left(\left\lfloor\frac{j}{2^i}\right\rfloor,2\right)==1}(\text{Decoder Input 152})_j - \sum_{mod\left(\left\lfloor\frac{j}{2^i}\right\rfloor,2\right)==0}(\text{Decoder Input 152})_j$$

Decoder input 252 is a series of log likelihood ratio vales (LLRs), and the binary output is also a series of LLRs. The aforementioned equation applies for the natural non-binary LLRs over $GF(2^q)$ (LLR0, LLR1 ... LLR$2^q$−1) relating to corresponding hard decisions (0, 2 ... $2^q$−1).

The configured binary decoder circuit applies a binary decoding algorithm to yield a decoded output that is provided to a binary to non-binary converter circuit. The binary to non-binary converter circuit converts the decoded output to a non-binary decoded output 267. In some cases, the conversion is done in accordance with the following equations:

$$(\text{Non-Binary Output 267})_i = \sum_{mod\left(\left\lfloor\frac{i}{2^j}\right\rfloor,2\right)==1}\frac{e^{(\text{Decoded Output})_j}}{1+e^{(\text{Decoded Output})_j}} + \sum_{mod\left(\left\lfloor\frac{i}{2^j}\right\rfloor,2\right)==0}\frac{1}{1+e^{(\text{Decoded Output})_j}}$$

Non-binary decoder output 267 is a series of log likelihood ratio vales (LLRs), and the decoded output is also a series of LLRs. The aforementioned equation applies for the natural non-binary LLRs over $GF(2^q)$ (LLR0, LLR1 ... LLR$2^q$−1) relating to corresponding hard decisions (0, 2 ... $2^q$−1). Non-binary decoder output 267 is provided to controller circuit 275. Depending upon the results indicated by non-binary decoder output 267 is provided to controller circuit 275, controller circuit 275 provides either output codeword 272, decoder output 254, or selects one of non-binary decoder circuit 266 or binary decoder circuit 264 to perform a subsequent local iteration through data decoder circuit 270.

Alternatively, where non-binary output 267 fails to converge (i.e., fails to yield the original data set) and a subsequent iteration through data decoder circuit 270 is not desired, controller circuit 275 provides a decoder output 254 (i.e., non-binary decoder output 267 or converted non-binary decoder output 276) back to central memory circuit 250 via global interleaver/de-interleaver circuit 284. Prior to storage of decoded output 254 to central memory circuit 250, decoded output 254 is globally de-interleaved to yield a globally de-interleaved output 288 that is stored to central memory circuit 250. The global de-interleaving reverses the global interleaving earlier applied to stored codeword 286 to yield decoder input 252. Once data detector circuit 230 is available, a previously stored de-interleaved output 288 is accessed from central memory circuit 250 and locally de-interleaved by a de-interleaver circuit 244. De-interleaver circuit 244 re-arranges decoder output 248 to reverse the shuffling originally performed by interleaver circuit 242. A resulting de-interleaved output 297 is provided to data detector circuit 230 where it is used to guide subsequent detection of a corresponding data set receive as equalized output 225.

Figure 3:
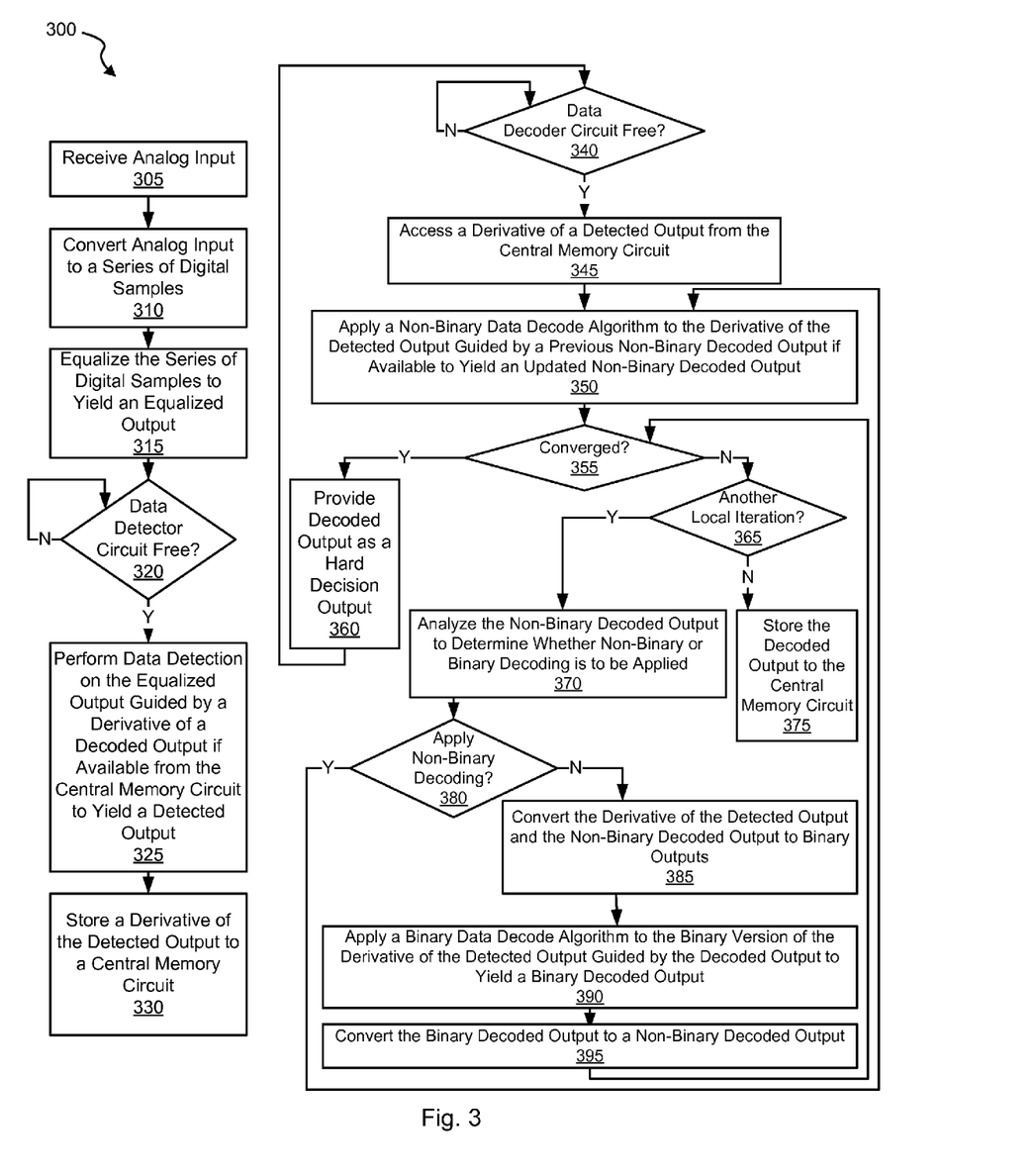
FIG. 3 is a flow diagram showing method for selectively using non-binary and binary data decoding to recover originally written data in accordance with various embodiments of the present invention.

Turning to FIG. 3, a flow diagram 300 shows a method for selectively using non-binary and binary data decoding to recover originally written data in accordance with various embodiments of the present invention. Following flow diagram 300, an analog input is received (block 305). The analog input may be derived from, for example, a storage medium or a data transmission channel. Based upon the disclosure provided herein, one of ordinary skill in the art will recognize a variety of sources of the analog input. The analog input is converted to a series of digital samples (block 310). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 315). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 320). Where a data detector circuit is available (block 320), a data detection algorithm is applied to the equalized output guided by a data set derived from a decoded output where available (e.g., the second and later iterations through the data detector circuit and the data decoder circuit) from a central memory circuit to yield a detected output (block 325). In some embodiments of the present invention, data detection algorithm is a Viterbi algorithm as are known in the art. In other embodiments of the present invention, the data detection algorithm is a maximum a posteriori data detector circuit as are known in the art. The data set derived from the decoded output maybe a de-interleaved version of the decoded data set. A signal derived from the detected output (e.g., a locally interleaved version of the detected output) is stored to the central memory to await processing by a data decoder circuit (block 330).

In parallel to the previously discussed data detection processing, it is determined whether a data decoder circuit is available (block 340). Where the data decoder circuit is available (block 340), a previously stored derivative of a detected output is accessed from the central memory (block 345). A non-binary data decode algorithm is applied to the derivative of the detected output which, in this case, is a series of non-binary symbols, to yield a non-binary decoded output (block 350). Where a previous non-binary decoded output corresponding to the derivative of the detected output, it is used to guide the non-binary data decode algorithm. Otherwise, the non-binary data decode algorithm is applied without guidance from a previous iteration. Of note, any non-binary data decoder algorithm known in the art may be used. In some cases, the non-binary data decode algorithm is a low density parity check decode algorithm as are known in the art. In one particular case, the non-binary data decode algorithm may be implemented similar to that described in U.S. patent application Ser. No. 13/180,495 entitled "Min-Sum Based Non-Binary LDPC Decoder", and filed Jul. 11, 2011 by Wang et al. Based upon the disclosure provided herein, one of ordinary skill in the art will recognize a variety of non-binary data decode algorithms that may be used in relation to different embodiments of the present invention.

It is determined whether the non-binary decoded output converged (i.e., the original data set is recovered) (block 355). In some cases, such convergence is found where all of the checksum equations utilized as part of the non-binary data decode algorithm are correct. Where the non-binary data decode algorithm converged (block 355), the decoded output is provided as a hard decision output (block 360). Otherwise, where the non-binary data decode algorithm failed to converge (block 355), it is determined whether the number of local iterations of the data decode algorithm on the current data set is exceeded a desired number of local iterations (block 365). In some cases, the number of local iterations is four. Based upon the disclosure provided herein, one of ordinary skill in the art will recognize other numbers of local iterations that may be used in relation to different embodiments of the present invention. Where the number of local iterations has exceeded the desired number (block 365), the current non-binary decoded output is stored to the central memory circuit (block 375), and a subsequent global iteration is applied when the data detector circuit becomes free (block 320).

Otherwise, where the number of local iterations has not exceeded the desired number (block 365), the non-binary decoded output is analyzed to determine whether a subsequent iteration will apply the non-binary data decode algorithm or a binary data decode algorithm (block 370). In some cases, the next local iteration always alternates based upon what the prior local iteration used. For example, if a prior local iteration used a non-binary data decode algorithm, then on the next local iteration a binary data decode algorithm is applied. In other cases, the number of outstanding errors in the non-binary decoded output is used to determine whether the next local iteration will apply a non-binary data decode algorithm or a binary data decode algorithm.

It is determined whether a non-binary data decode algorithm or a binary data decode algorithm is to be applied (block 380). Where a non-binary data decode algorithm is to be applied (block 380), the processes of blocks 350-380 are repeated using the non-binary decoded output as a guide. Alternatively, where a binary data decode algorithm is to be applied (block 380), the derivative of the detected output and the non-binary decoded output are converted to corresponding binary outputs (block 385). Such conversion may be done consistent with the following equation:

$$(\text{Binary Output})_i = \sum_{mod\left(\left|\frac{j}{2^i}\right|,2\right)==1} (\text{Decoder Input})_j - \sum_{mod\left(\left|\frac{j}{2^i}\right|,2\right)==0} (\text{Decoder Input})_j$$

The decoder input is the derivative of the detected output and includes a series of log likelihood ratio vales (LLRs), and the resulting binary output is also a series of LLRs.

A binary data decode algorithm is then applied to the binary output (i.e., a binary version of the derivative of the detected output) guided by the decoded output to yield a binary decoded output (block 390). The binary data decode algorithm may be, but is not limited to, a low density parity check decode algorithm circuit as are known in the art. Based upon the disclosure provided herein, one of ordinary skill in the art will recognize a variety of binary data decode algorithms that may be used in relation to different embodiments of the present invention. The binary decoded output is then converted to a corresponding non-binary decoded output (block 395). This conversion may be done in accordance with the following equation:

$$(\text{Non-Binary Output})_i = \sum_{mod\left(\left|\frac{i}{2j}\right|,2\right)==1} \frac{e^{(\text{Decoded Output})_j}}{1+e^{(\text{Decoded Output})_j}} + \sum_{mod\left(\left|\frac{i}{2j}\right|,2\right)==0} \frac{1}{1+e^{(\text{Decoded Output})_j}}$$

where the decoded output is the aforementioned binary decoded output. At this juncture, the processes of blocks 355-395 are repeated using the resulting non-binary decoded output.

Figure 4:
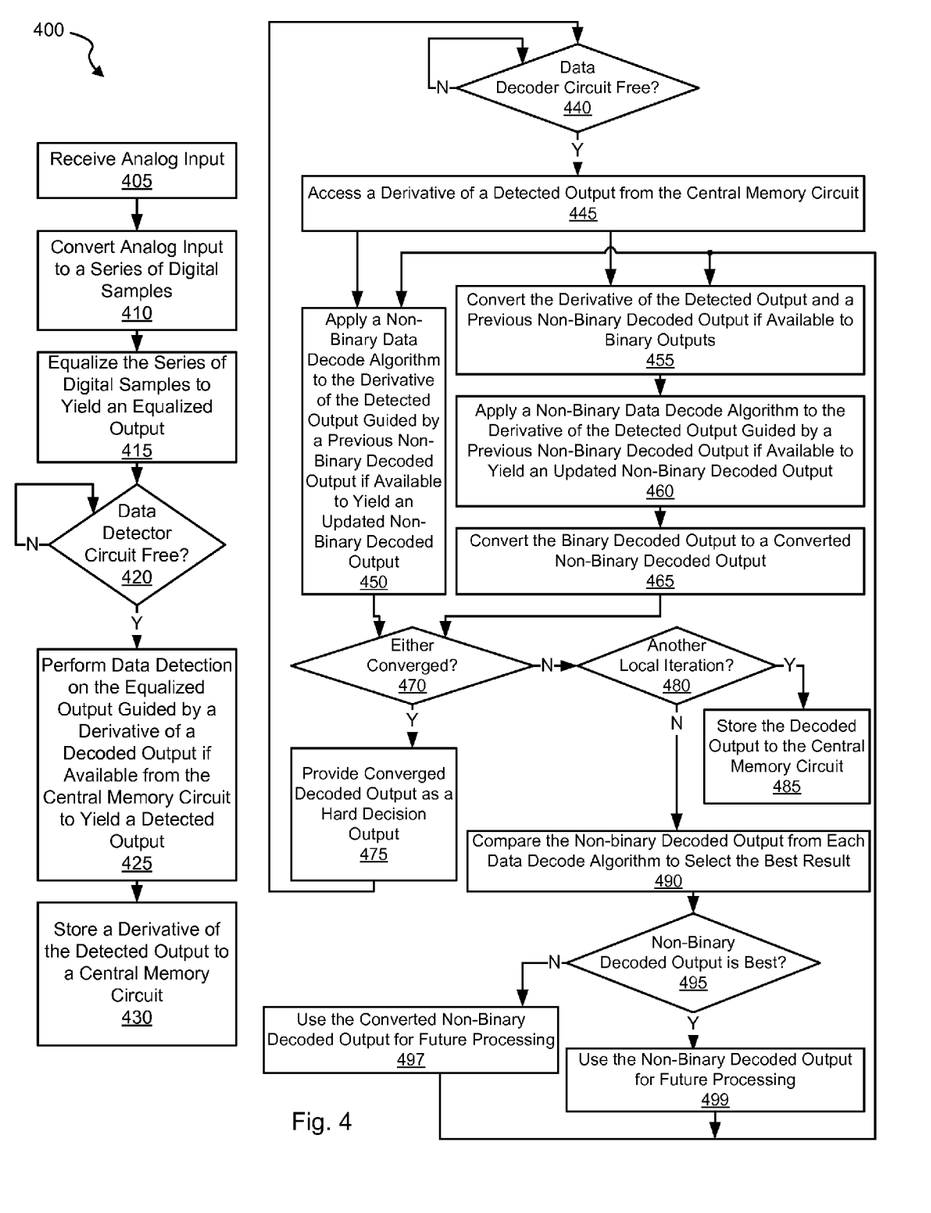
FIG. 4 is a flow diagram showing method for parallel use of non-binary data decoding and binary data decoding to recover originally written data in accordance with some embodiments of the present invention.

FIG. 4 is a flow diagram 400 showing method for parallel use of non-binary data decoding and binary data decoding to recover originally written data in accordance with some embodiments of the present invention. Following flow diagram 400, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 420). Where a data detector circuit is available (block 420), a data detection algorithm is applied to the equalized output guided by a data set derived from a decoded output where available (e.g., the second and later iterations through the data detector circuit and the data decoder circuit) from a central memory circuit to yield a detected output (block 425). In some embodiments of the present invention, data detection algorithm is a Viterbi algorithm as are known in the art. In other embodiments of the present invention, the data detection algorithm is a maximum a posteriori data detector circuit as are known in the art. The data set derived from the decoded output maybe a de-interleaved version of the decoded data set. A signal derived from the detected output (e.g., a locally interleaved version of the detected output) is stored to the central memory to await processing by a data decoder circuit (block 430).

In parallel to the previously discussed data detection processing, it is determined whether a data decoder circuit is available (block 440). Where the data decoder circuit is available (block 440), a previously stored derivative of a detected output is accessed from the central memory (block 445). Both a non-binary data decode algorithm and a binary data decode algorithm are applied to the derivative of a detected output in parallel. In particular, the non-binary data decode algorithm is applied to the derivative of the detected output which, in this case, is a series of non-binary symbols, to yield a non-binary decoded output (block 450). Where a previous non-binary decoded output corresponding to the derivative of the detected output, it is used to guide the non-binary data decode algorithm. Otherwise, the non-binary data decode algorithm is applied without guidance from a previous iteration. Of note, any non-binary data decoder algorithm known in the art may be used. In some cases, the non-binary data decode algorithm is a low density parity check decode algorithm as are known in the art. In one particular case, the non-binary data decode algorithm may be implemented similar to that described in U.S. patent application Ser. No. 13/180,495 entitled "Min-Sum Based Non-Binary LDPC Decoder", and filed Jul. 11, 2011 by Wang et al. Based upon the disclosure provided herein, one of ordinary skill in the art will recognize a variety of non-binary data decode algorithms that may be used in relation to different embodiments of the present invention.

In parallel, the derivative of the detected output and, if available, a previous non-binary decoded output are converted to corresponding binary outputs (block 455). Such conversion may be done consistent with the following equation:

$$(\text{Binary Output})_i = \sum_{mod\left(\left\lfloor\frac{j}{2^i}\right\rfloor,2\right)==1} (\text{Decoder Input})_j - \sum_{mod\left(\left\lfloor\frac{j}{2^i}\right\rfloor,2\right)==0} (\text{Decoder Input})_j$$

The decoder input is the derivative of the detected output and includes a series of log likelihood ratio vales (LLRs), and the resulting binary output is also a series of LLRs.

A binary data decode algorithm is then applied to the binary output (i.e., a binary version of the derivative of the detected output) guided by the decoded output to yield a binary decoded output (block 460). The binary data decode algorithm may be, but is not limited to, a low density parity check decode algorithm circuit as are known in the art. Based upon the disclosure provided herein, one of ordinary skill in the art will recognize a variety of binary data decode algorithms that may be used in relation to different embodiments of the present invention. The binary decoded output is then converted to a corresponding non-binary decoded output (block 465). This conversion may be done in accordance with the following equation:

$$(\text{Non-Binary Output})_i = \sum_{mod\left(\left\lfloor\frac{j}{2^i}\right\rfloor,2\right)==1} \frac{e^{(\text{Decoded Output})_j}}{1+e^{(\text{Decoded Output})_j}} + \sum_{mod\left(\left\lfloor\frac{j}{2^i}\right\rfloor,2\right)==0} \frac{1}{1+e^{(\text{Decoded Output})_j}}$$

where the decoded output is the aforementioned binary decoded output.

It is determined whether the non-binary decoded output from either application of the binary data decode algorithm or the non-binary data decode algorithm converged (i.e., the original data set is recovered) (block 470). In some cases, such convergence is found where all of the checksum equations utilized as part of the non-binary data decode algorithm or the binary data decode algorithm are correct. Where the non-binary data decode algorithm converged (block 470), the resulting non-binary decoded output is provided as a hard decision output (block 475). Alternatively, where the binary data decode algorithm converged (block 470), the resulting non-binary decoded output is provided as a hard decision output (block 475).

Otherwise, where both the non-binary data decode algorithm and the binary data decode algorithm failed to converge (block 470), it is determined whether the number of local iterations of the data decode algorithm on the current data set is exceeded a desired number of local iterations (block 480). In some cases, the number of local iterations is four. Based upon the disclosure provided herein, one of ordinary skill in the art will recognize other numbers of local iterations that may be used in relation to different embodiments of the present invention. Where the number of local iterations has exceeded the desired number (block 480), the current non-binary decoded output is stored to the central memory circuit (block 485), and a subsequent global iteration is applied when the data detector circuit becomes free (block 420).

Otherwise, where the number of local iterations has not exceeded the desired number (block 480), the non-binary decoded output provided by the non-binary data decode algorithm and the converted non-binary decoded output provided by the binary data decoder algorithm are compared to determine which will be used to guide subsequent application of the non-binary data decode algorithm and the binary data decode algorithm (block 490). Where it is determined that the non-binary decoded output derived from application of the non-binary data decode algorithm is as good or better than the converted non-binary decoded output derived from application of the binary data decode algorithm (block 495), the non-binary decoded output derived from application of the non-binary data decode algorithm is used to govern subsequent applications of both the non-binary data decode algorithm and the binary data decode algorithm to the derivative of the detected output (block 499). Otherwise, the converted non-binary decoded output derived from application of the binary data decode algorithm is used to govern subsequent applications of both the non-binary data decode algorithm and the binary data decode algorithm to the derivative of the detected output (block 497).

Figure 5:
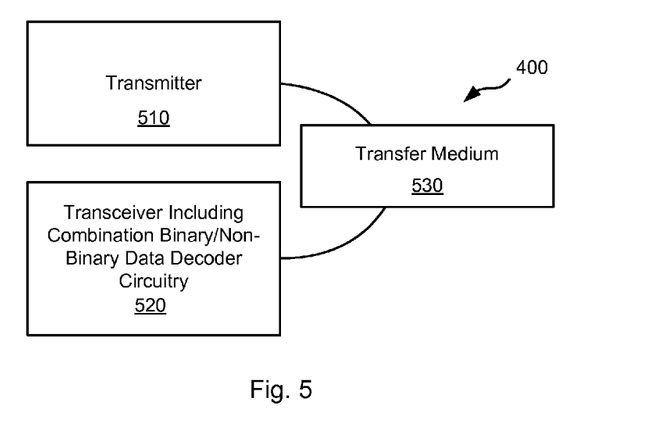
FIG. 5 shows a data transmission system including combination binary/non-binary data decoder circuitry in accordance with various embodiments of the present invention.

Turning to FIG. 5, a data transmission system 400 including combination data decoder circuitry in accordance with various embodiments of the present invention. Data transmission system 400 includes a transmitter 410 that is operable to transmit encoded information via a transfer medium 430 as is known in the art. The encoded data is received from transfer medium 430 by receiver 420. Transceiver 420 incorporates combination data decoder circuitry. While processing received data, received data is converted from an analog signal to a series of corresponding digital samples, and the digital samples are equalized to yield an equalized output. The equalized output is then provided to a data processing circuit including both a data detector circuit and a data decoder circuit. Data is passed between the data decoder and data detector circuit via a central memory allowing for variation between the number of processing iterations that are applied to different data sets. It should be noted that transfer medium 430 may be any transfer medium known in the art including, but not limited to, a wireless medium, an optical medium, or a wired medium. Based upon the disclosure provided herein, one of ordinary skill in the art will recognize a variety of transfer mediums that may be used in relation to different embodiments of the present invention.

During operation, data decoding applied to the information received via transfer medium 430. The data decoding applied to the information received may use both a binary data decode algorithm and a non-binary data decode algorithm operating in parallel and using one result from either data decoding processes to guide future operations. Alternatively, during operation data decoding applied to the information received may first perform one of a binary data decode algorithm or a non-binary data decode algorithm, and selectively use one of binary data decode algorithm or a non-binary data decode algorithm on a subsequent operation. Such combination data decoding may be done using a circuit similar to that described above in relation to FIG. 1 or FIG. 2, and/or may be done using a method similar to that described above in relation to FIG. 3 or FIG. 4.

Figure 6:
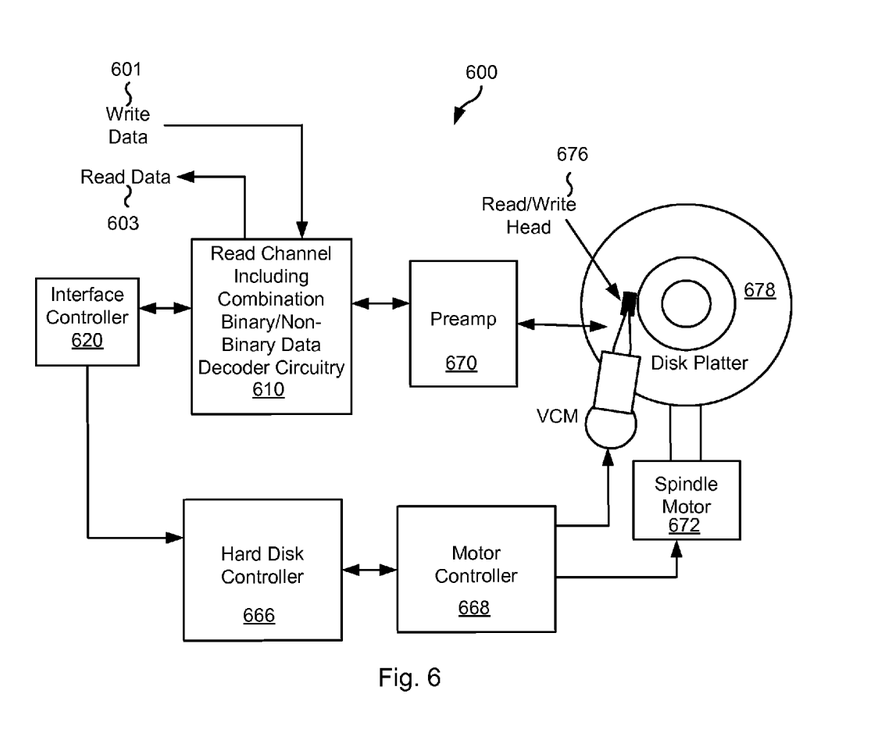
FIG. 6 shows a storage device including combination binary/non-binary data decoder circuitry in accordance with one or more embodiments of the present invention.

Turning to FIG. 6, a storage device 600 including combination data decoder circuitry in accordance with one or more embodiments of the present invention. Storage device 600 may be, for example, a hard disk drive. Storage device 600 also includes a preamplifier 670, an interface controller 620, a hard disk controller 666, a motor controller 668, a spindle motor 672, a disk platter 678, and a read/write head assembly 676. Interface controller 620 controls addressing and timing of data to/from disk platter 678. The data on disk platter 678 consists of groups of magnetic signals that may be detected by read/write head assembly 676 when the assembly is properly positioned over disk platter 678. In one embodiment, disk platter 678 includes magnetic signals recorded in accordance with either a longitudinal or a perpendicular recording scheme.

In a typical read operation, read/write head assembly 676 is accurately positioned by motor controller 668 over a desired data track on disk platter 678. Motor controller 668 both positions read/write head assembly 676 in relation to disk platter 678 and drives spindle motor 672 by moving read/write head assembly to the proper data track on disk platter 678 under the direction of hard disk controller 666. Spindle motor 672 spins disk platter 678 at a determined spin rate (RPMs). Once read/write head assembly 678 is positioned adjacent the proper data track, magnetic signals representing data on disk platter 678 are sensed by read/write head assembly 676 as disk platter 678 is rotated by spindle motor 672. The sensed magnetic signals are provided as a continuous, minute analog signal representative of the magnetic data on disk platter 678. This minute analog signal is transferred from read/write head assembly 676 to read channel circuit 610 via preamplifier 670. Preamplifier 670 is operable to amplify the minute analog signals accessed from disk platter 678. In turn, read channel circuit 610 decodes and digitizes the received analog signal to recreate the information originally written to disk platter 678. This data is provided as read data 603 to a receiving circuit. A write operation is substantially the opposite of the preceding read operation with write data 601 being provided to read channel circuit 610. This data is then encoded and written to disk platter 678.

During operation, data decoding applied to the information received may use both a binary data decode algorithm and a non-binary data decode algorithm operating in parallel and using one result from either data decoding processes to guide future operations. Alternatively, during operation data decoding applied to the information received may first perform one of a binary data decode algorithm or a non-binary data decode algorithm, and selectively use one of binary data decode algorithm or a non-binary data decode algorithm on a subsequent operation. Such combination data decoding may be done using a circuit similar to that described above in relation to FIG. 1 or FIG. 2, and/or may be done using a method similar to that described above in relation to FIG. 3 or FIG. 4.

It should be noted that storage system may utilize SATA, SAS or other storage technologies known in the art. Also, it should be noted that storage system 600 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 600, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
  a combination data decoder circuit including:
    a non-binary data decoder circuit operable to apply a non-binary data decode algorithm to a non-binary decoder input to yield a non-binary decoded output;
    a non-binary symbol to binary symbol conversion circuit operable to convert a non-binary symbol in the non-binary decoder input into a corresponding binary symbol in a binary decoder input;
    a binary data decoder circuit operable to apply a binary data decode algorithm to the binary decoder input to yield a binary decoded output; and
    a binary symbol to non-binary symbol converter circuit operable to convert a binary symbol in the binary decoded output into a corresponding non-binary symbol in a converted non-binary decoded output.

2. The data processing system of claim 1, wherein the non-binary data decoder circuit and the binary data decoder circuit share common circuitry.

3. The data processing system of claim 1, wherein the combination data decoder circuit further comprises:
  a controller circuit operable to enable one of the non-binary data decoder circuit or the binary data decoder circuit to operate on the non-binary decoder input.

4. The data processing system of claim 1, wherein the non-binary data decoder circuit is operable to apply the non-binary data decode algorithm to the non-binary decoder input in parallel to the binary data decoder circuit applying the binary data decode algorithm to the binary decoder input, and wherein the combination data decoder circuit further comprises:

a controller circuit operable to select one of the non-binary decoded output and the converted non-binary decoded output for use in subsequent operation of the combination data decoder circuit.

5. The data processing system of claim 1, wherein the non-binary data decode algorithm is a low density parity check algorithm.

6. The data processing system of claim 5, wherein the non-binary decoder input is a series of two bit non-binary symbols.

7. The data processing system of claim 1, wherein the binary data decode algorithm is a low density parity check algorithm.

8. The data processing system of claim 1, wherein the non-binary decoder input is a series of two bit non-binary symbols, wherein the non-binary decoder outputs is a series of two bit non-binary symbols, and wherein the converted non-binary decoder outputs is a series of two bit non-binary symbols.

9. The data processing system of claim 1, wherein the data processing system further comprises:

a data detector circuit operable to apply a data detection algorithm to a data set to yield a detected output, wherein the non-binary decoder input is derived from the detected output.

10. The data processing system of claim 9, wherein the data detection algorithm is selected from a group consisting of: a maximum a posteriori data detection algorithm and a Viterbi detection algorithm.

11. The data processing circuit of claim 1, wherein the data processing system is implemented as part of a device selected from a group consisting of: a storage device, and a receiving device.

12. The data processing system of claim 1, wherein the data processing system is implemented as part of an integrated circuit.

13. A method for data processing, the method comprising:
applying a non-binary data decode algorithm to a non-binary decoder input to yield a first decoded output;
applying a binary data decode algorithm to a derivative of the non-binary decoder input to yield a second decoded output;
selecting one of the first decoded output and the second decoded output that corresponds to an original data set; and
providing a data output derived from the selected one of the first decoded output and the second decoded output as a data output.

14. The method of claim 13, wherein the method further comprises:
converting a non-binary symbol value in the non-binary decoder input to a corresponding binary value in a binary decoder input, wherein the derivative of the non-binary decoder input is the binary decoder input; and
converting the second decoded output to a non-binary decoded output, wherein selecting one of the first decoded output and the second decoded output involves selecting one of the first decoded output and the non-binary decoded output.

15. The method of claim 13, wherein applying the non-binary data decode algorithm to the non-binary decoder input is done in parallel with applying the binary data decode algorithm to the derivative of the non-binary decoder input.

16. The method of claim 13, wherein applying the non-binary data decode algorithm to the non-binary decoder input is completed prior to applying the binary data decode algorithm to the derivative of the non-binary decoder input.

17. The method of claim 16, wherein applying the binary data decode algorithm to the derivative of the non-binary decoder input is guided by the first decoded output.

18. A storage device, the storage device comprising:
a storage medium;
a head assembly disposed in relation to the storage medium and operable to provide a sensed signal corresponding to information on the storage medium;
a read channel circuit including:
an analog to digital converter circuit operable to sample an analog signal derived from the sensed signal to yield a series of digital samples;
an equalizer circuit operable to equalize the digital samples to yield a data set;
a data detector circuit operable to apply a data detection algorithm to the data set to yield a detected output; and
a combination data decoder circuit including:
a non-binary data decoder circuit operable to apply a non-binary data decode algorithm to a non-binary decoder input to yield a non-binary decoded output, wherein the non-binary decoded input is derived from the detected output;
a non-binary symbol to binary symbol conversion circuit operable to convert a non-binary symbol in the non-binary decoder input into a corresponding binary symbol in a binary decoder input;
a binary data decoder circuit operable to apply a binary data decode algorithm to the binary decoder input to yield a binary decoded output; and
a binary symbol to non-binary symbol converter circuit operable to convert a binary symbol in the binary decoded output into a corresponding non-binary symbol in a converted non-binary decoded output.

19. The storage device of claim 18, wherein applying the non-binary data decode algorithm to the non-binary decoder input is done in parallel with applying the binary data decode algorithm to the binary decoder input.

20. The storage device of claim 18, wherein applying the binary data decode algorithm to the binary decoder input is guided by the non-binary decoded output.

21. A data processing system, the data processing system comprising:
a non-binary data decoder circuit operable to apply a non-binary data decode algorithm to a non-binary decoder input to yield a non-binary decoded output;
a binary data decoder circuit operable to apply a binary data decode algorithm to the binary decoder input to yield a binary decoded output;
wherein the non-binary data decoder circuit and the binary data decoder circuit share common circuitry.

22. The data processing system of claim 21, wherein the data processing system further comprises:
a non-binary symbol to binary symbol conversion circuit operable to convert a non-binary symbol in the non-binary decoder input into a corresponding binary symbol in a binary decoder input.

23. The data processing system of claim 22, wherein the data processing system further comprises:
a binary symbol to non-binary symbol converter circuit operable to convert a binary symbol in the binary decoded output into a corresponding non-binary symbol in a converted non-binary decoded output.

24. The data processing system of claim 23, wherein the non-binary decoder input is a series of two bit non-binary symbols, wherein the non-binary decoder outputs is a series of two bit non-binary symbols, and wherein the converted non-binary decoder outputs is a series of two bit non-binary symbols.

25. The data processing system of claim 21, wherein the data processing system further comprises:
a controller circuit operable to enable one of the non-binary data decoder circuit or the binary data decoder circuit to operate on the non-binary decoder input.

26. The data processing system of claim 21, wherein the non-binary data decoder circuit is operable to apply the non-binary data decode algorithm to the non-binary decoder input in parallel to the binary data decoder circuit applying the binary data decode algorithm to the binary decoder input, and wherein the data processing system further comprises:
a controller circuit operable to select one of the non-binary decoded output and the converted non-binary decoded output for use in subsequent operation of the combination data decoder circuit.

27. The data processing system of claim 21, wherein the non-binary decoder input is a series of two bit non-binary symbols.

28. The data processing system of claim 21, wherein the data processing system further comprises:
a data detector circuit operable to apply a data detection algorithm to a data set to yield a detected output, wherein the non-binary decoder input is derived from the detected output.

29. The data processing circuit of claim 21, wherein the data processing system is implemented as part of a device selected from a group consisting of: a storage device, and a receiving device.

30. The data processing system of claim 21, wherein the data processing system is implemented as part of an integrated circuit.

* * * * *